(12) United States Patent
Rong et al.

(10) Patent No.: US 11,350,527 B2
(45) Date of Patent: May 31, 2022

(54) CIRCUIT BOARD ASSEMBLY, DISPLAY DEVICE AND METHOD FOR MANUFACTURING THE SAME

(71) Applicants: K-TRONICS (SUZHOU) TECHNOLOGY CO., LTD., Jiangsu (CN); BOE TECHNOLOGY GROUP CO., LTD., Beijing (CN)

(72) Inventors: Qigui Rong, Beijing (CN); Yin Huang, Beijing (CN); Liushuai Zhao, Beijing (CN)

(73) Assignees: K-TRONICS (SUZHOU) TECHNOLOGY CO., LTD., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 16/642,442

(22) PCT Filed: Jul. 31, 2019

(86) PCT No.: PCT/CN2019/098562
§ 371 (c)(1),
(2) Date: Feb. 27, 2020

(87) PCT Pub. No.: WO2020/024974
PCT Pub. Date: Feb. 6, 2020

(65) Prior Publication Data
US 2020/0253055 A1 Aug. 6, 2020

(30) Foreign Application Priority Data
Aug. 1, 2018 (CN) .......................... 201821236099.5

(51) Int. Cl.
*H05K 1/14* (2006.01)
*H05K 1/18* (2006.01)
*H05K 3/36* (2006.01)

(52) U.S. Cl.
CPC ............. *H05K 1/144* (2013.01); *H05K 1/181* (2013.01); *H05K 3/368* (2013.01);
(Continued)

(58) Field of Classification Search
CPC ... H05K 1/11; H05K 1/14; H05K 1/18; H05K 1/141–144; H05K 3/36; H05K 3/368; H05K 7/14; H05K 7/16; H05K 7/20
(Continued)

(56) References Cited

U.S. PATENT DOCUMENTS 5,610,801 A * 3/1997 Begis ..................... H05K 7/023
361/784
6,303,989 B1 * 10/2001 Yasuho ................... H01L 25/18
257/706
(Continued)

FOREIGN PATENT DOCUMENTS

CN 201348752 11/2009
CN 101640012 2/2010
(Continued)

*Primary Examiner* — Tuan T Dinh
(74) *Attorney, Agent, or Firm* — Calfee, Halter & Griswold LLP (57) ABSTRACT

Disclosed is a circuit board assembly, a display device, and a method for manufacturing the same. The display device includes a main board, a logic board, a X-coordinate circuit board and a display panel. The main board and the logic board forms a circuit board assembly with a stacked structure, and the logic board is connected to the X-coordinate circuit board by a flexible flat cable line.

8 Claims, 6 Drawing Sheets

(52) U.S. Cl.
CPC .............. *H05K 2201/10128* (2013.01); *H05K 2201/10325* (2013.01); *H05K 2201/10356* (2013.01)

(58) Field of Classification Search
USPC ................ 361/770–790, 792, 803, 794–795; 257/685–730; 349/149–152
See application file for complete search history.

(56) References Cited

U.S. PATENT DOCUMENTS

| | | | | |
|---|---|---|---|---|
| 6,477,593 | B1* | 11/2002 | Khosrowpour | G06F 13/4027 361/790 |
| 6,731,514 | B2* | 5/2004 | Evans | H05K 1/144 361/785 |
| 7,420,819 | B2* | 9/2008 | Yang | G06F 1/185 361/782 |
| 8,902,598 | B2* | 12/2014 | Chin | H05K 7/1467 361/752 |
| 10,187,989 | B2* | 1/2019 | Dunkel | A63H 29/22 |
| 2001/0031568 | A1* | 10/2001 | Brekosky | H01R 12/7082 439/74 |
| 2008/0101049 | A1* | 5/2008 | Casto | H05K 1/14 361/788 |
| 2009/0286186 | A1* | 11/2009 | Kondoh | G06F 3/045 430/313 |
| 2010/0195303 | A1* | 8/2010 | Ishikawa | H01R 12/722 361/790 |
| 2012/0002133 | A1* | 1/2012 | Yamazaki | G09G 3/342 349/61 |
| 2012/0273687 | A1* | 11/2012 | Nariyuki | G01T 1/244 250/366 |
| 2013/0130734 | A1* | 5/2013 | Rice | H04W 24/00 455/517 |
| 2013/0300959 | A1 | 11/2013 | Chen | |
| 2014/0198273 | A1 | 7/2014 | Wang | |
| 2015/0146400 | A1* | 5/2015 | Huffman | H05K 1/144 361/790 |
| 2017/0354031 | A1* | 12/2017 | Aoki | H01L 23/345 |

FOREIGN PATENT DOCUMENTS

| | | |
|---|---|---|
| CN | 102098425 | 6/2011 |
| CN | 202210832 | 5/2012 |
| CN | 202364299 | 8/2012 |
| CN | 102662265 | 9/2012 |
| CN | 103077690 | 5/2013 |
| CN | 204087198 | 1/2015 |
| CN | 208538435 | 2/2019 |

\* cited by examiner

CIRCUIT BOARD ASSEMBLY, DISPLAY DEVICE AND METHOD FOR MANUFACTURING THE SAME

CROSS REFERENCE TO RELATED APPLICATIONS

The present application is a 35 U.S.C. 371 national stage application of a PCT International Application No. PCT/CN2019/098562, filed on Jul. 31, 2019, which claims the benefit of Chinese Patent Application No. 201821236099.5 entitled "Display Device", filed on Aug. 1, 2018, the contents of which are incorporated herein by reference in their entireties.

TECHNICAL FIELD

The present disclosure relates to the technical field of display devices, and in particular to an arrangement of circuit boards within a display device, and further to a method for manufacturing the display device.

BACKGROUND

With the continuous improvement of people's living standards, display devices such as liquid crystal televisions have widely appeared in people's lives. The existing liquid crystal television usually comprises a main board (also referred to as a television main board or a TV main board) and a logic board. The logic board is generally set in the following two manners. The first manner is to integrate the logic board on the television main board, but this manner will increase the area of the television main board and also limit the output mode of the television main board, so that the television main board must be customized and thus can only support a corresponding kind of screen, thereby restricting the scope of application of the television main board. The second manner is to make the logic board as an independent board card, and then fix the logic board on the display panel of the liquid crystal television. However, fixing the logic board to the display panel will occupy the space of the display panel and increase the area of the display panel. At the same time, an additional low voltage differential signaling (also called LVDS) line is needed to connect the television main board to transmit LVDS signals. Either manner, it will increase the cost of the liquid crystal television.

SUMMARY

According to an exemplary embodiment, there is provided a circuit board assembly comprising: a first circuit board comprising a first surface and a second surface opposite to the first surface, and a first connecting member being provided on the first surface of the first circuit board; a second circuit board comprising a first surface and a second surface opposite to the first surface, and a second connecting member being provided on the second surface of the second circuit board; wherein the first connecting member and the second connecting member are configured to be capable of being directly connected together in cooperation with each other; wherein when the first connecting member and the second connecting member are directly connected together, the circuit board assembly forms a stacked configuration in which the first surface of the first circuit board and the second surface of the second circuit board are facing each other.

According to some exemplary embodiments, the first connecting member is a pin header, and the second connecting member is a socket; or the first connecting member is a socket, and the second connecting member is a pin header.

According to some exemplary embodiments, the second connecting member is provided on the second surface of the second circuit board in a surface-mount form.

According to some exemplary embodiments, at least one surface of the first surface and the second surface of the second circuit board is provided with a plurality of components, and the components are all chip-shaped components and all are provided on the at least one surface in a surface-mount form.

According to another exemplary embodiment, there is provided a display device comprising the circuit board assembly as described above.

According to some exemplary embodiments, the first circuit board is a main board, the second circuit board is a logic board, and the first connecting member and the second connecting member are configured to transmit low voltage differential signals between the main board and the logic board.

According to some exemplary embodiments, the first connecting member is a pin header (for example, without limitation, a DuPont pin header), and the second connecting member is a corresponding socket.

According to some exemplary embodiments, the logic board is a timing-sequence control circuit board.

According to some exemplary embodiments, the display device further comprises an X-coordinate circuit board; a flexible flat cable holder is provided on the first surface of the logic board, and the flexible flat cable holder is connected to a signal interface of the X-coordinate circuit board through a flexible flat cable line.

According to some exemplary embodiments, from the flexible flat cable holder to the signal interface, with respect to the main board, the flexible flat cable line is only adjacent to the first surface of the main board.

According to some exemplary embodiments, the flexible flat cable line comprises at least one gap extending along a length direction of the flexible flat cable line between two ends of the flexible flat cable line.

According to some exemplary embodiments, from the flexible flat cable holder to the signal interface, with respect to the main board, the flexible flat cable line starts from the flexible flat cable holder to extend adjacent to the first surface of the main board and along a first direction away from the signal interface to an edge of the main board, and the flexible flat cable line passes around the main board at the edge to extend adjacent to the second surface of the main board and along a second direction opposite to the first direction.

According to some exemplary embodiments, the flexible flat cable line is surrounded by a heat-shrinkable sleeve and a metal foil.

According to some exemplary embodiments, the flexible flat cable holder is provided on the first surface of the logic board in a surface-mount form.

According to some exemplary embodiments, the display device is a liquid crystal television, a plasma television, or a tablet computer.

According to a further exemplary embodiment, there is provided a method for manufacturing the display device as described above, comprising the following steps: directly connecting the logic board to the main board to form the circuit board assembly; and connecting the flexible flat cable holder of the logic board to the signal interface of the X-coordinate circuit board by using the flexible flat cable line.

According to some exemplary embodiments, the step of connecting the flexible flat cable holder of the logic board to the signal interface of the X-coordinate circuit board by using the flexible flat cable line comprises: connecting the flexible flat cable line to the flexible flat cable holder; extending the flexible flat cable line adjacent to the first surface of the main board to an edge of the main board; and making the flexible flat cable line leave the main board from the edge, and extending and connecting the flexible flat cable line to the signal interface.

According to some exemplary embodiments, at least one gap extending along a length direction of the flexible flat cable line is formed between two ends of the flexible flat cable line.

According to some exemplary embodiments, the step of connecting the flexible flat cable holder of the logic board to the signal interface of the X-coordinate circuit board by using the flexible flat cable line comprises: connecting the flexible flat cable line to the flexible flat cable holder; extending the flexible flat cable line adjacent to the first surface of the main board and along a first direction away from the signal interface to a first edge of the main board; passing the flexible flat cable line around the first edge, extending the flexible flat cable line adjacent to the second surface of the main board and along a second direction opposite to the first direction to a second edge of the main board; and making the flexible flat cable line leave the main board from the second edge, and extending and connecting the flexible flat cable line to the signal interface.

According to some exemplary embodiments, use a heat-shrinkable sleeve and a metal foil to surround the flexible flat cable line.

BRIEF DESCRIPTION OF THE DRAWINGS

Exemplary implementations of the present disclosure will be described in detail below with reference to the accompanying drawings, so as to have a better appreciation and understanding of the problems to be solved by the present disclosure, the above and further objectives, features and advantages.

It is to be understood that the drawings are for the purpose of illustrating exemplary embodiments, and therefore, they are not necessarily drawn to scale. Furthermore, the same or similar parts, components, and/or elements are indicated by the same reference numerals throughout the drawings.

DETAILED DESCRIPTION OF EMBODIMENTS

Exemplary embodiments will be described in detail below with reference to the accompanying drawings.

It will be understood that, although the terms "first", "second", "third", etc. may be used herein to describe various elements, components and/or parts, these elements, components and/or parts should not be limited by these terms. These terms are only used to distinguish one element, component or part from another. Thus, a first element, component or part discussed below can also be termed as a second or third element, component or part without departing from the teachings of the present disclosure.

The terms used herein are for the purpose of describing particular embodiments only and is not intended to limit the disclosure. As used herein, the singular forms "a," "an," and "the" are intended to comprise the plural forms as well, unless the context clearly indicates otherwise. It will be further understood that the terms "comprising" and/or "including", when used in this specification, specify the existence of involved features, entities, steps, operations, elements and/or components, but do not exclude the presence or addition of one or more other features, entities, steps, operations, elements, components, and/or groups thereof. As used herein, the term "and/or" comprises any and all combinations of one or more of the associated listed items.

It will be understood that when an element is referred to as being "connected to another element", or "coupled to another element", it may be directly connected to another element or directly coupled to another element, or there may be an intermediate element. In contrast, when an element is referred to as being "directly connected to another element" or "directly coupled to another element", no intermediate element exists.

Unless otherwise defined, all terms (comprising technical and scientific terms) used herein have the same meaning as commonly understood by one of ordinary skill in the art to which this disclosure belongs. It will be further understood that terms such as those defined in commonly used dictionaries should be interpreted to have meanings consistent with their meaning in the relevant field and/or context of this specification, and will not be interpreted in an idealized or overly formal sense, unless explicitly so defined in this context.

It should be noted that, in the description of the specification of this application, the expressions such as "one embodiment", "some embodiments", "exemplary embodiments", "specific examples", or "some examples", mean that the specific feature(s), structure(s), material(s) or characteristic(s) described in connection with the embodiment or example is comprised in at least one embodiment or example of the present disclosure. Therefore, in this text, the schematic descriptions for the above expressions are not necessarily only for the same embodiments or examples. Rather, the specific feature(s), structure(s), material(s) or characteristic(s) described may be combined in any suitable manner in any one or more embodiments or examples. In addition, without any contradiction, those skilled in the art may integrate and combine different embodiments or examples and features of the different embodiments or examples described in this specification.

The steps comprised in the methods described in this disclosure are all exemplary, and they do not necessarily have to be performed according to the listed order, but one or more of these steps may be performed in a different order or simultaneously according to the actual situation. In addition, according to the actual situation, the described methods may further comprise other additional steps.

For the purpose of clarity, certain technologies, structures, and materials well-known in the art to which this disclosure belongs have not been described in detail to avoid making the application verbose.

Figure 1:
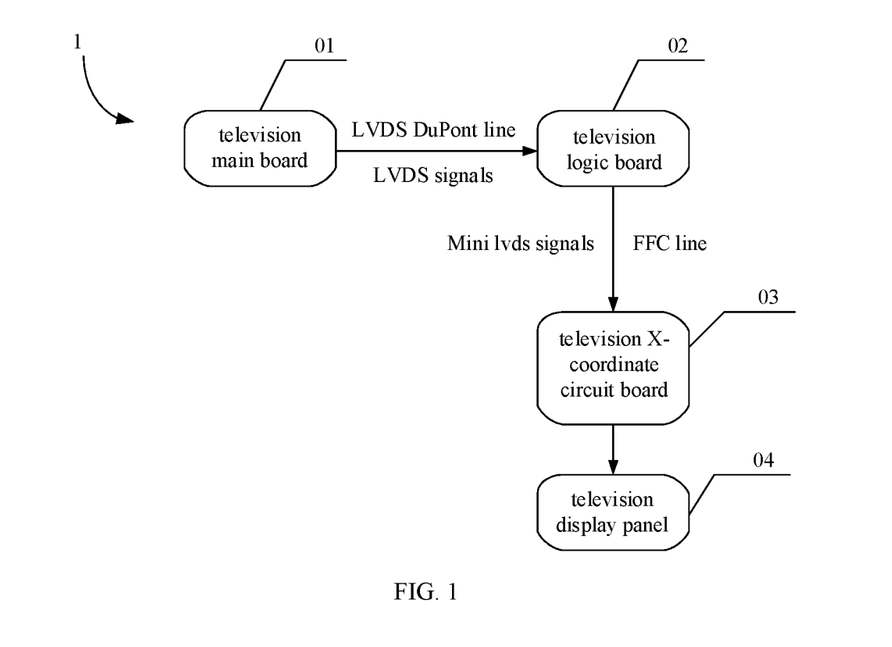
FIG. 1 is a schematic diagram schematically showing a connection relationship between components in a display device in the related art.

Referring to FIG. 1, a connection relationship between components in a liquid crystal television 1 according to the related art is schematically shown, and an arrow line indicates the connection relationship between the components and also shows the signaling between the components. The liquid crystal television 1 comprises a television main board 01, a television logic board 02, a television X-coordinate circuit board 03 (also referred to as an X-PCBor an X-board), and a television display panel 04. The television logic board 02 is an independent board card, so it generally needs to be fixed on the television display panel 04. The television logic board 02 and the television main board 01 are connected through an LVDS DuPont line in order to transmit LVDS signals. In addition, the television logic board 02 is also connected to the television X-coordinate circuit board 03 on the television display panel 04 through a flexible flat cable (also referred to as FFC) line, so as to transmit mini lvds signals. It is easy to understand that fixing the television logic board 02 to the television display panel 04 will occupy the area of the television display panel 04, resulting in having to increase the area of the television display panel 04. In addition, the television logic board 12 will require additional LVDS DuPont lines to connect the television main board 01, these all increase the cost of the liquid crystal television.

FIG. 2 to FIG. 8 schematically illustrate various aspects of a display device according to an exemplary embodiment. The exemplary embodiment does not limit the specific type of the display device, as long as it comprises the main board 11 and the logic board 12. As a non-limiting example, the display device according to an exemplary embodiment may be a liquid crystal television, a plasma television, a tablet computer, or the like.

Figure 2:
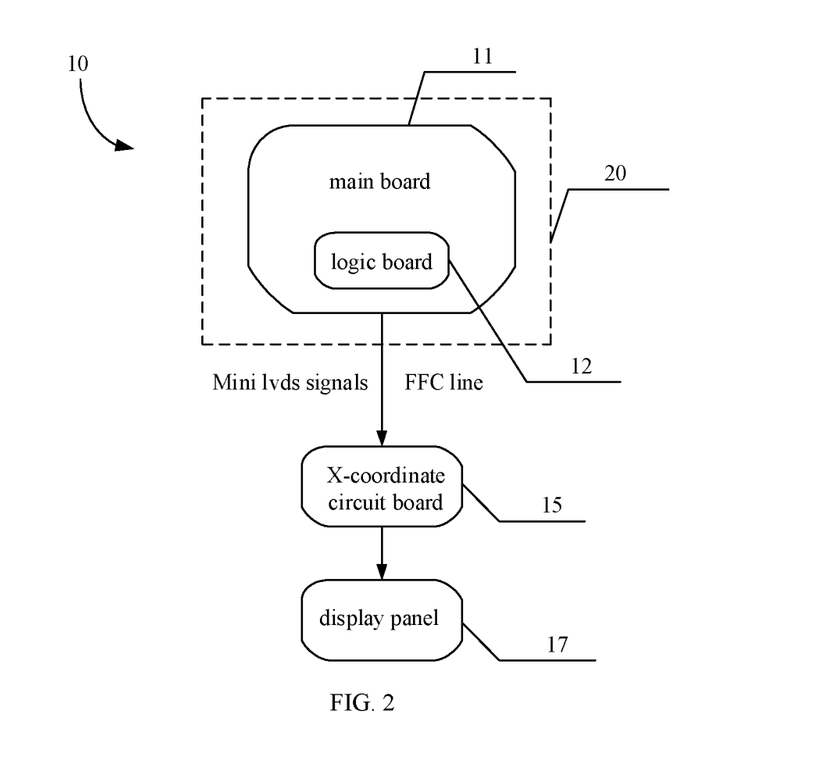
FIG. 2 is a schematic diagram schematically showing a connection relationship between components in a display device according to an exemplary embodiment.

Referring to FIG. 2, a connection relationship of components in a display device 10 according to an exemplary embodiment is schematically illustrated. The display device 10 comprises a main board 11, a logic board 12, an X-coordinate circuit board 15, and a display panel 17. The main board 11 and the logic board 12 form a circuit board assembly 20 with a stacked structure. The logic board 12 constituting the circuit board assembly 20 is also connected to the X-coordinate circuit board 15 through a flexible flat cable line so as to transmit mini lvds signals.

Figure 3:
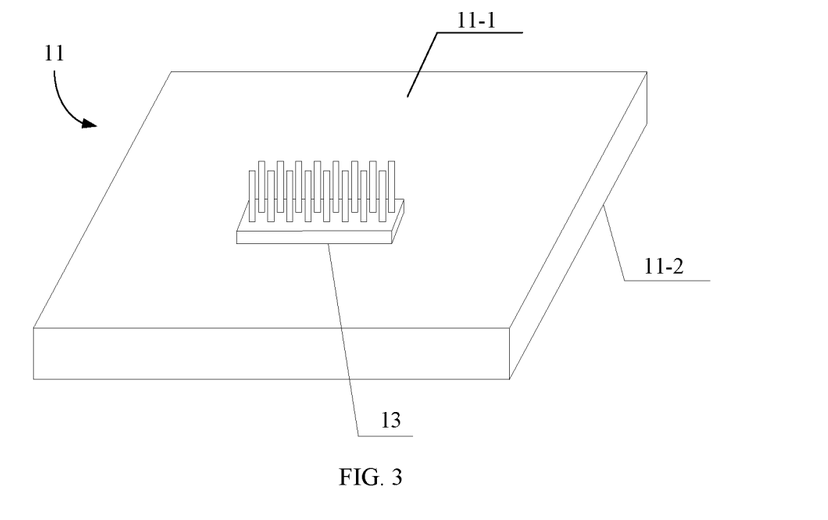
FIG. 3 is a schematic perspective view of the main board shown in FIG. 2, in which a first connecting member provided on the main board is shown.

Turning now to FIG. 3, the main board 11 in the display device 10 shown in FIG. 2 is schematically shown in a perspective view. The main board 11 comprises a first surface 11-1 and a second surface 11-2 that are opposite to each other, and various types components and multiple circuit traces required for the main board 11 may be disposed on at least one surface of the first surface 11-1 and the second surface 11-2. As shown in FIG. 3, the first surface 11-1 of the main board 11 is provided with a first connecting member 13 for directly connecting the main board 11 and the logic board 12 to form the circuit board assembly 20.

Figure 4:
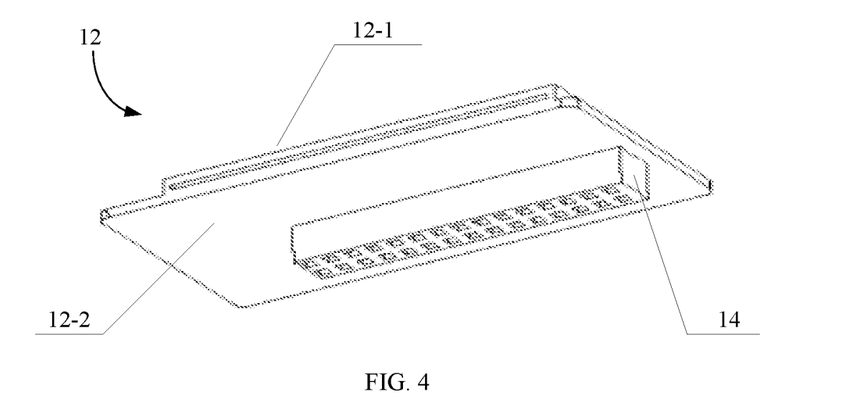
FIG. 4 is a schematic perspective view of the logic board shown in FIG. 2, in which a second connecting member provided on the logic board is shown.

Referring to FIG. 4, the logic board 12 in the display device 10 shown in FIG. 2 is schematically shown in a perspective view. The logic board 12 also comprises a first surface 12-1 and a second surface 12-2 that are opposite to each other, and various types components and multiple circuit traces required for the logic board 12 may be disposed on at least one surface of the first surface 12-1 and the second surface 12-2. As shown in FIG. 4, the second surface 12-2 of the logic board 12 is provided with a second connecting member 14. The second connecting member 14 is configured to cooperate with the first connecting member 13 so that the second connecting member 14 can be directly connected to the first connecting member 13 so as to form the circuit board assembly 20. In some exemplary embodiments, the first connecting member 13 may be a pin header or a socket, and the second connecting member 14 may be a corresponding socket or a pin header. Further, in some exemplary embodiments, the first connecting member 13 and the second connecting member 14 are configured to be capable of transmit low voltage differential signals between the main board 11 and the logic board 12.

Figure 5:
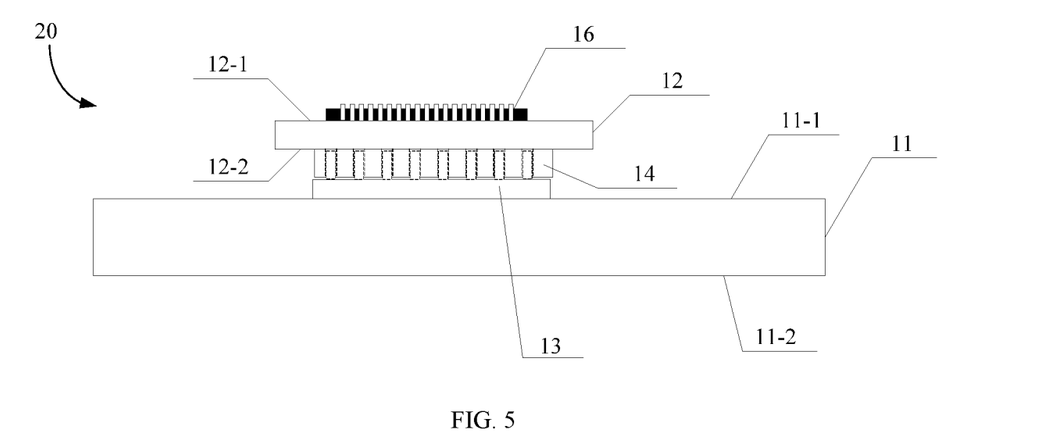
FIG. 5 schematically illustrates a circuit board assembly formed when the main board and the logic board shown in FIG. 2 are directly connected together.

Referring to FIG. 5, it schematically illustrates the circuit board assembly 20 formed when the main board 11 and the logic board 12 shown in FIG. 2, FIG. 3 and FIG. 4 are directly connected together through the first connecting member 13 and the second connecting member 14. In the formed circuit board assembly 20, the main board 11 and the logic board 12 form a stacked structure, in which the first surface 11-1 of the main board 11 and the second surface 12-2 of the logic board 12 are facing each other, thereby making full use of the three-dimensional space above the main board 11, reducing the area occupation to the main board 11 when the logic board 12 is integrated on the main board 11, and reducing the area occupation to the display panel 17 when the logic board 12 is fixed on the display panel 17. It is easy to understand that the first connecting member 13 may also be provided on other surfaces of the main board 11, and similarly, the second connecting member 14 may also be provided on other surfaces of the logic board 12, as long as the first connecting member 13 and the second connecting member 14 can be directly connected so that the main board 11 and the logic board 12 form a circuit board assembly with a stacked structure.

It is to be noted that the exemplary embodiments do not limit the specific structures, types, sizes, and the like of the main board 11 and the logic board 12. As a non-limiting example, the main board 11 may be a television main board, and the logic board 12 may be a timing-sequence control (TCON) circuit board. In addition, the exemplary embodiments also do not limit the specific structures, types, sizes, and the like of the first connecting member 13 and the second connecting member 14, as long as the first connecting member 13 and the second connecting member 14 can be directly connected so that the main board 11 and the logic board 12 form the circuit board assembly 20 with a stacked structure. As a non-limiting example, the first connecting member 13 may be a DuPont pin header (also referred to as an LVDS pin header), and the second connecting member 14 may be a socket (also referred to as an LVDS socket) that cooperates with the DuPont pin header; alternatively, the first connecting member 13 may be an LVDS socket, and the second connecting member 14 may be an LVDS pin header that cooperates with the LVDS socket.

With continued reference to FIGS. 3 and 4, when the first connecting member 13 is an LVDS pin header and the second connecting member 14 is an LVDS socket that cooperates with the LVDS pin header, that is, the first surface 11-1 of the main board 11 is provided with a LVDS pin header and the second surface 12-2 of the logic board 12 is provided with a LVDS socket, the LVDS pin header is inserted into the LVDS socket, so that the electrical connection between the main board 11 and the logic board 12 can be achieved, thereby enabling the transmission of LVDS signals. In this way, the LVDS DuPont line required when the logic board is connected to the main board in the related art is omitted, thereby reducing the cost of the display device. The exemplary embodiment does not limit the specific manner in which the LVDS socket is disposed on the surface of the logic board 12. In some exemplary embodiments, in order to optimize the structure, the LVDS socket is generally manufactured on the surface of the logic board 12 in the surface-mount form by using surface-mount technology.

Compared with the related art, for the display device 10 provided according to the exemplary embodiment, the first surface 11-1 of the main board 11 is provided with the first connecting member 13, and the second surface 12-2 of the logic board 12 is provided with the second connecting member 14, and the main board 11 and the logic board 12 are directly connected together through the first connecting member 13 and the second connecting member 14, so that the main board 11 and the logic board 12 form the stacked circuit board assembly 20, in which the first surface 11-1 of the main board 11 and the second surface 12-2 of the logic board 12 are facing each other, thereby making full use of the three-dimensional space above the main board 11, reducing the area occupation to the main board 11 when the logic board 12 is integrated on the main board 11, and reducing the area occupation to the display panel 17 when the logic board 12 is fixed on the display panel 17, which saves the cost of the display device. In addition, since the first connecting member 13 and the second connecting member 14 are configured to be capable of transmitting low voltage differential signals, when the first connecting member 13 and the second connecting member 14 are connected, the low voltage differential signals can be transmitted between the main board 11 and the logic board 12, thereby eliminating the LVDS DuPont line required for transmitting low voltage differential signals between the logic board and the main board in the related art, and further saving the cost of the display device.

It should be noted that, since the logic board 12 and the main board 11 are detachable, when the main board 11 is matched with a normal screen (also referred to as a norm screen), the logic board 12 does not need to be provided on the main board 11, so that the logic board 12 can be removed from the main board 11. When the main board 11 is matched with a timing-sequence control less screen (also referred to as a TCONLESS screen), the logic board 12 may be installed on the main board 11. Through such a setting, the main board 11 can be compatible with a norm screen and a TCONLESS screen, thereby expanding the applicable range of the main board 11.

Referring back to FIG. 2, the display device 10 according to the exemplary further comprises an X-coordinate circuit board 15, and the logic board 12 constituting the circuit board assembly 20 may be connected to the X-coordinate circuit board 15 through a flexible flat cable line to transmit mini lvds signals.

Figure 6:
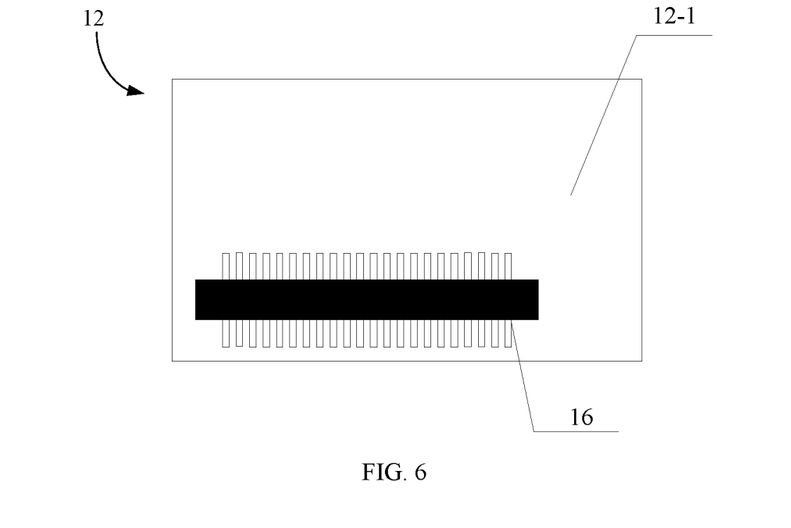
FIG. 6 schematically illustrates a surface of the logic board shown in FIG. 2 on which a flexible flat cable holder is provided.

With reference to FIGS. 5 and 6 and with continued reference to FIG. 2, the first surface 12-1 of the logic board 12 is provided with a flexible flat cable holder 16. It should be understood, however, that it is also possible to arrange the flexible flat cable holder 16 on other surfaces of the logic board 12, such as the second surface 12-2. In some exemplary embodiments, the flexible flat cable holder 16 is manufactured on the surface of the logic board 12 in the surface-mount form by using surface-mount technology.

Figure 7:
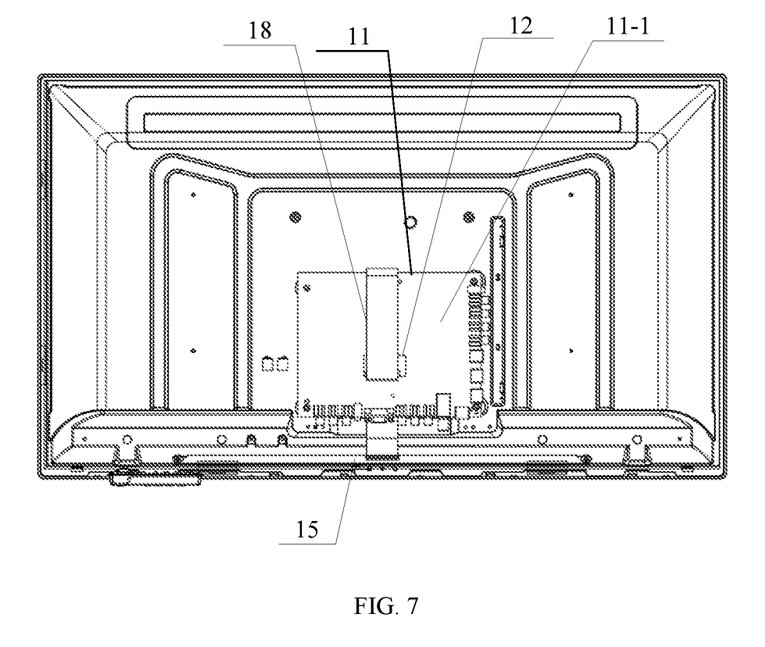
FIG. 7 schematically illustrates a connection manner of a logic board and an X-coordinate circuit board according to an exemplary embodiment.
Figure 8:
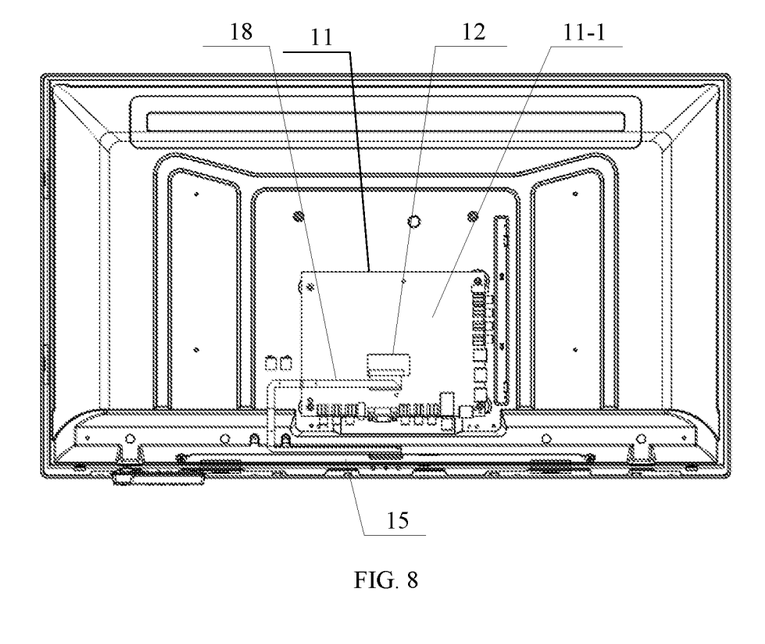
FIG. 8 schematically illustrates another connection manner of a logic board and an X-coordinate circuit board according to an exemplary embodiment.

With reference to FIGS. 7 and 8 and with continued reference to FIGS. 2, 5, and 6, two connection manners for connecting the flexible flat cable holder 16 and the signal interface of the X-coordinate circuit board 15 by using the flexible flat cable line 18 are shown.

The first connection manner is shown in FIG. 7. The flexible flat cable line 18 starts from the flexible flat cable holder 16 to firstly extend adjacent to the first surface 11-1 of the main board 11 and along a first direction away from the signal interface of the X-coordinate circuit board 15 to an edge of the main board 11, and then the flexible flat cable line 18 passes around the edge of the main board 11. After that, the flexible flat cable line 18 extends adjacent to the second surface 11-2 of the main board 11 and along a second direction opposite to the first direction to another edge of the main board 11. The flexible flat cable line 18 leaves the main board 11 from this edge of the main board 11, and finally extends and connects to the signal interface of the X-coordinate circuit board 15. In this connection manner, a conventional flexible flat cable line 18 may be used. However, since the flexible flat cable line 18 is too close to the power line of the display device, an anti-interference treatment may be performed on the flexible flat cable line 18 in some exemplary embodiments. It is easily understood that the flexible flat cable line 18 may be processed by any suitable anti-interference treatment measures known in the art. In some exemplary embodiments, the flexible flat cable line 18 may be surrounded by a heat-shrinkable sleeve and/or a metal foil (such as, but not limited to, an aluminum foil) so as to ensure the insulation between the flexible flat cable line 18 and the power line of the display device, and the elimination of electromagnetic interference from the power line to the flexible flat cable line 18.

The second connection manner is shown in FIG. 8. With respect to the main board 11, the flexible flat cable line 18 extends only adjacent to the first surface 11-1 of the main board 11. For example, the flexible flat cable line 18 starts from the flexible flat cable holder 16 to extend adjacent to the first surface 11-1 of the main board 11 to the left edge of the main board 11. Then the flexible flat cable line 18 exits from the left side of the main board 11 and finally extends and connects to the signal interface of the X-coordinate circuit board 15. However, in this connection manner, the flexible flat cable line 18 needs to be bent and twisted. Therefore, in some exemplary embodiments, the flexible flat cable line 18 needs to be manufactured by a slitting and cutting process, that is, at least one gap extending along a length direction of the flexible flat cable line 18 may be formed in a suitable manner (for example, but not limited to, cutting) between two ends of the flexible flat cable line 18, thereby causing the portion of the flexible flat cable line 18 between its two ends to form at least two strands of cables extending along its length direction. The flexible flat cable line 18 manufactured by a slitting and cutting process can be easily bent and twisted, thereby facilitating the connection of the flexible flat cable line 18 between the flexible flat cable holder 16 and the signal interface of the X-coordinate circuit board 15. It should be noted that the number and formation positions of the gaps can be selected according to actual needs. As a non-limiting example, the power line in the flexible flat cable line 18 may be separated from other signal lines so that it can form a single strand of cable. Alternatively, the portion of the flexible flat cable line 18 located between the two ends thereof can be divided into multiple strands of cables, each of which has an equal number of signal lines. Further, in some exemplary embodiments, a distance between signal lines constituting the flexible flat cable line 18 is smaller at the two ends of the flexible flat cable line 18 and larger at a middle portion of the flexible flat cable line 18. Such a structure is advantageous for slitting and cutting the flexible flat cable line 18.

It should be noted that the main board 11 may comprise multiple circuit traces and multiple components, and the logic board 12 may also comprise multiple circuit traces and multiple chip-shaped components. In some exemplary embodiments, a plurality of chip-shaped components on the main board 11 and the logic board 12 adopt their smallest packages as much as possible, and plug-in components such as sockets and pin headers also adopt a surface mount package, enabling the optimization of the structure, layout and wiring, and reducing the size of the logic board 12. In some exemplary embodiments, the plurality of chip-shaped components on the logic board 12 are all surface-mounted on the first surface 12-1 and the second surface 12-2 by using a surface-mount technology. That is, a double-sided surface mount structure is adopted, which can further reduce the size of the logic board 12. In some exemplary embodiments, the reference size of the logic board 12 may be set to 40 cm×22 cm based on the size of the surrounding space of the LVDS sockets on the multiple main boards 11. However, the exemplary embodiments are not limited thereto.

Figure 9:
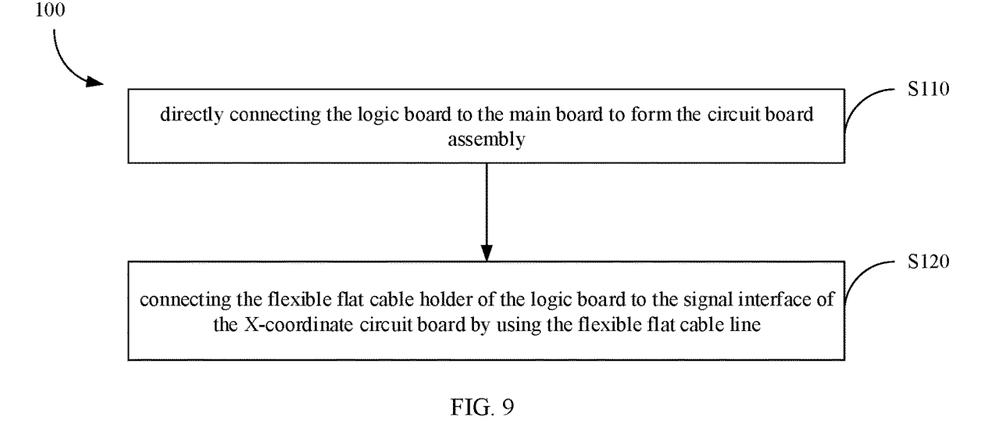
FIG. 9 schematically illustrates, in a flowchart form, a method for manufacturing a display device according to an exemplary embodiment.

Referring now to FIG. 9 and with continued reference to FIGS. 2 to 8, FIG. 9 schematically illustrates, in a flowchart form, a method 100 for manufacturing the display device 10 of the present disclosure, according to an exemplary embodiment. As already explained above, the exemplary embodiment does not limit the specific type of the display device, as long as it comprises the main board 11 and the logic board 12. As a non-limiting example, the display device according to an exemplary embodiment may be a liquid crystal television, a plasma television, a tablet computer, or the like.

The method 100 comprises the following steps:

S110: directly connecting the logic board 12 to the main board 11 to form the circuit board assembly 20; and S120: connecting the flexible flat cable holder 16 of the logic board 12 to the signal interface of the X-coordinate circuit board 15 by using the flexible flat cable line 18.

Figure 10:
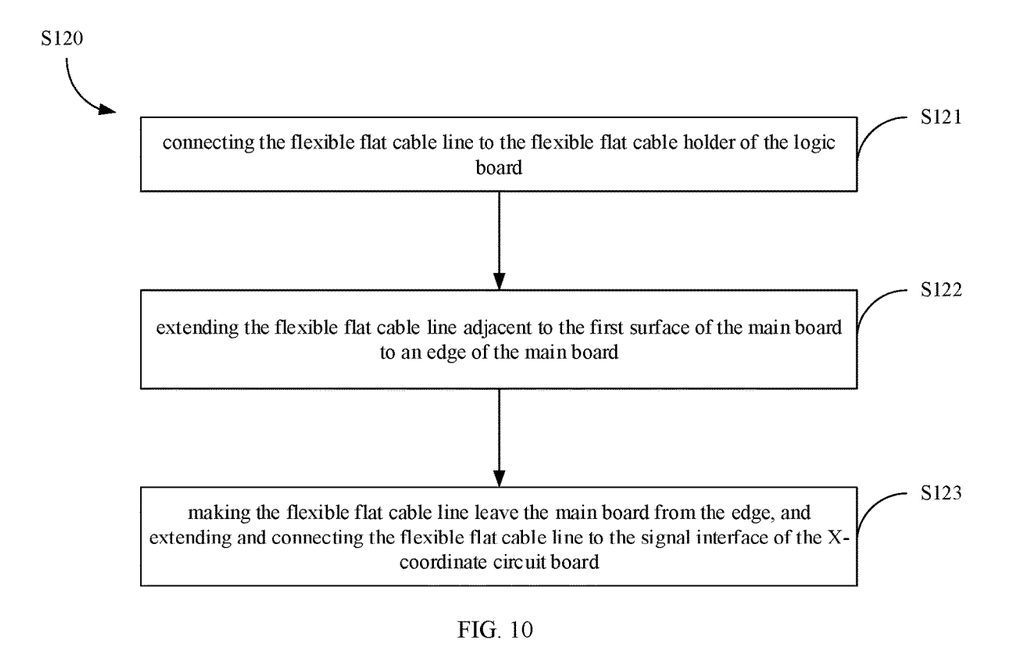
FIG. 10 schematically illustrates, in a flowchart form, a manner for connecting the flexible flat cable holder of the logic board to the signal interface of the X-coordinate circuit board by using the flexible flat cable line as in the method shown in FIG. 9.

Referring to FIG. 10 and referring to FIG. 8 and FIG. 9 in combination, FIG. 10 schematically illustrates a manner for connecting the flexible flat cable holder of the logic board to the signal interface of the X-coordinate circuit board by using the flexible flat cable line in the step 120 of the method 100.

As shown in FIG. 10, the step 120 may comprise the following steps:

S121: connecting the flexible flat cable line 18 to the flexible flat cable holder 16 of the logic board 12;

S122: extending the flexible flat cable line 18 adjacent to the first surface 11-1 of the main board 11 to an edge of the main board 11; and S123: making the flexible flat cable line 18 leave the main board 11 from the edge, and extending and connecting the flexible flat cable line 18 to the signal interface of the X-coordinate circuit board 15.

In some exemplary embodiments, when the method shown in FIG. 10 is adopted, the flexible flat cable line 18 may be manufactured by a slitting and cutting process, so that the flexible flat cable line 18 can be easily bent and twisted, thereby facilitating the connection of the flexible flat cable line 18 between the flexible flat cable holder 16 and the signal interface of the X-coordinate circuit board 15.

Figure 11:
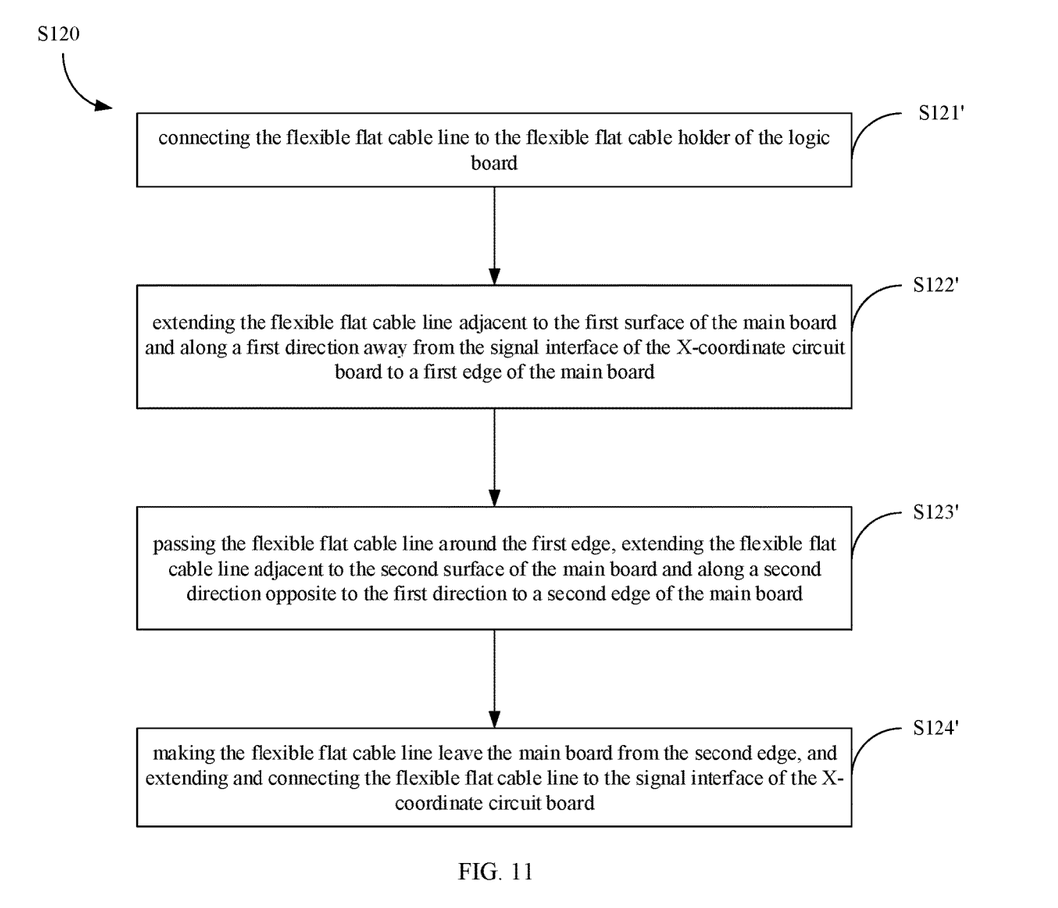
FIG. 11 schematically illustrates, in a flowchart form, another manner for connecting the flexible flat cable holder of the logic board to the signal interface of the X-coordinate circuit board by using the flexible flat cable line as in the method shown in FIG. 9.

Referring to FIG. 11 and referring to FIGS. 7 and 9 in combination, FIG. 11 schematically illustrates another manner for connecting the flexible flat cable holder of the logic board to the signal interface of the X-coordinate circuit board by using the flexible flat cable line in the step 120 of the method 100.

As shown in FIG. 11, step 120 may comprise the following steps:

S121': connecting the flexible flat cable line 18 to the flexible flat cable holder 16 of the logic board 12;

S122': extending the flexible flat cable line 18 adjacent to the first surface 11-1 of the main board 11 and along a first direction away from the signal interface of the X-coordinate circuit board 15 to a first edge of the main board 11;

S123': passing the flexible flat cable line 18 around the first edge, extending the flexible flat cable line 18 adjacent to the second surface 11-2 of the main board 11 and along a second direction opposite to the first direction to a second edge of the main board 11; and S124': making the flexible flat cable line 18 leave the main board 11 from the second edge, and extending and connecting the flexible flat cable line 18 to the signal interface of the X-coordinate circuit board 15.

In some exemplary embodiments, when the method shown in FIG. 11 is adopted, the flexible flat cable line 18 may be subjected to anti-interference treatment (for example, a heat-shrinkable sleeve and/or a metal foil (for example but not limited to an aluminum foil) can be used to surround the flexible flat cable line 18) in order to ensure the insulation between the flexible flat cable line 18 and the power line of the display device, and the elimination of electromagnetic interference from the power line to the flexible flat cable line 18.

The above description is merely a description of the exemplary embodiments and an explanation of the technical principles of the exemplary embodiments. Those skilled in the art should understand that the scope of the present disclosure is not limited to the technical solutions formed by the specific combinations of the above technical features, but should also cover, without departing from the inventive concept, other technical solutions formed by arbitrarily combining the above technical features or their equivalent features without violating technical principles. In addition, a person of ordinary skill in the art may make various modifications and variations to the described exemplary embodiments without departing from the spirit of the present disclosure, and these modifications and variations shall also be deemed to fall within the scope of the present disclosure.

Therefore, the protection scope of the present disclosure shall be subject to the scope of the appended claims.

What is claimed is:

1. A display device comprising:
    a circuit board assembly comprising:
        a main board comprising a first surface and a second surface opposite to the first surface, and a first connecting member being provided on the first surface of the main board;
        a logic board comprising a first surface and a second surface opposite to the first surface, a flexible flat cable holder being provided on the first surface of the logic board, and a second connecting member being provided on the second surface of the logic board;
    an X-coordinate circuit board comprising a signal interface,
    wherein the first connecting member and the second connecting member are directly connected together in cooperation with each other to transmit low voltage differential signals between the main board and the logic board;
    wherein the circuit board assembly forms a stacked configuration in which the first surface of the main board and the second surface of the logic board are facing each other;
    wherein the flexible flat cable holder is connected to the signal interface of the X-coordinate circuit board through a flexible flat cable line;
    wherein from the flexible flat cable holder to the signal interface, with respect to the main board, the flexible flat cable line is only adjacent to the first surface of the main board;
    wherein the flexible flat cable line comprises at least one gap extending along a length direction of the flexible flat cable line between two ends of the flexible flat cable line; and
    wherein a power line in the flexible flat cable line is separated from other signal lines and forming a single strand of cable.

2. The display device according to claim 1, wherein the first connecting member is a DuPont pin header, and the second connecting member is a corresponding socket.

3. The display device according to claim 1, wherein the logic board is a timing-sequence control circuit board.

4. The display device according to claim 1, wherein the flexible flat cable holder is provided on the first surface of the logic board in a surface-mount form.

5. The display device according to claim 1, wherein the display device is a liquid crystal television, a plasma television, or a tablet computer.

6. A method for manufacturing the display device according to claim 1, comprising the following steps:
    forming the at least one gap extending along the length direction of the flexible flat cable and between the two ends of the flexible flat cable line, and making the power line in the flexible flat cable line separated from other signal lines to form the single strand of cable;
    directly connecting the logic board to the main board to form the circuit board assembly;
    connecting the flexible flat cable line to the flexible flat cable holder;
    making the flexible flat cable line extend adjacent to the first surface of the main board to an edge of the main board; and
    making the flexible flat cable line leave the main board from the edge, and connecting the flexible flat cable line to the signal interface.

7. The display device according to claim 1, wherein:
    the first connecting member is a pin header, and the second connecting member is a socket; or
    the first connecting member is a socket, and the second connecting member is a pin header.

8. The display device according to claim 1, wherein the second connecting member is provided on the second surface of the logic board in a surface-mount form.

* * * * *